United States Patent [19]

Dahbura et al.

[11] Patent Number: 4,991,176

[45] Date of Patent: Feb. 5, 1991

[54] OPTIMAL TEST GENERATION FOR FINITE STATE MACHINE MODELS

[75] Inventors: Anton T. Dahbura, Chester; Krishan K. Sabnani, Berkeley Heights; M. Umit Uyar, Sea Bright, all of N.J.

[73] Assignee: AT&T Bell Laboratories, Murray Hill, N.J.

[21] Appl. No.: 362,724

[22] Filed: Jun. 7, 1989

[51] Int. Cl.⁵ .............................................. G06F 11/00
[52] U.S. Cl. ...................................... 371/27; 371/15.1
[58] Field of Search ............... 371/27, 23, 22.1, 15.1; 324/73.1, 158 R; 364/489

[56] References Cited

U.S. PATENT DOCUMENTS

| | | | |
|---|---|---|---|
| 4,692,921 | 9/1987 | Dahbura et al. | 371/27 |
| 4,696,006 | 9/1987 | Kawai | 371/27 |
| 4,748,626 | 5/1988 | Wong | 371/43 X |

OTHER PUBLICATIONS

J. P. Roth, "Improved Test-Generating D-Algorithm", IBMTDB, vol. 20, No. 9, Feb. 1978, pp. 3792–3794.

Primary Examiner—Jerry Smith
Assistant Examiner—Robert W. Beausoliel
Attorney, Agent, or Firm—Gregory C. Ranieri

[57] ABSTRACT

Faster, yet, completely efficient and exhaustive testing is afforded an entity (e.g., protocol, VLSI circuit, software application) represented as finite state machines by employing the present method in which test sequences are generated according to minimum cost function rules. Minimum cost unique signatures are developed for state identification of the finite state machine. Based upon the minimum cost unique signatures, a minimum cost test sequence is generated to cover every state transition of the finite state machine. As a result, every testable aspect of the entity is guaranteed to be tested using a minimum number of steps which represents a considerable cost savings.

1 Claim, 5 Drawing Sheets

FIG. 4

| TEST SEQUENCE TABLE | | | | | |
| --- | --- | --- | --- | --- | --- |
| TOUR | STEP | CURRENT STATE | NEXT STATE | INPUT TO FSM | OUTPUT FROM FSM |
| TRAVERSE X $_{11}$ | 1 | S1 | S1 | a | x |
| | 2 | S1 | S1 | a | x |
| | 3 | S1 | S1 | a | x |
| TRAVERSE X $_{13}$ | 4 | S1 | S4 | c | y |
| | 5 | S4 | S3 | b | z |
| TRAVERSE Y $_{35}$ | 6 | S3 | S5 | a | y |
| TRAVERSE X $_{52}$ | 7 | S5 | S2 | b | y |
| | 8 | S2 | S3 | b | x |
| TRAVERSE X $_{35}$ | 9 | S3 | S5 | a | y |
| | 10 | S5 | S1 | a | z |
| TRAVERSE Y $_{14}$ | 11 | S1 | S4 | c | y |
| TRAVERSE X $_{45}$ | 12 | S4 | S5 | a | x |
| | 13 | S5 | S1 | a | z |
| TRAVERSE Y $_{14}$ | 14 | S1 | S4 | c | y |
| TRAVERSE Y $_{45}$ | 15 | S4 | S5 | a | x |
| TRAVERSE X $_{52}$ | 16 | S5 | S5 | c | y |
| | 17 | S5 | S1 | a | z |
| TRAVERSE Y $_{14}$ | 18 | S1 | S4 | c | y |
| TRAVERSE Y $_{45}$ | 19 | S4 | S5 | a | x |

FIG.4A

| TEST SEQUENCE TABLE | | | | | |
|---|---|---|---|---|---|
| TOUR | STEP | CURRENT STATE | NEXT STATE | INPUT TO FSM | OUTPUT FROM FSM |
| TRAVERSE Y 52 | 20 | S5 | S2 | b | y |
| TRAVERSE X 21 | 21 | S2 | S3 | b | x |
|  | 22 | S3 | S5 | a | y |
|  | 23 | S5 | S1 | a | z |
| TRAVERSE Y 14 | 24 | S1 | S4 | c | y |
| TRAVERSE Y 45 | 25 | S4 | S5 | a | x |
| TRAVERSE Y 52 | 26 | S5 | S2 | b | y |
| TRAVERSE X 22 | 27 | S2 | S1 | a | y |
|  | 28 | S1 | S1 | a | x |
|  | 29 | S1 | S1 | a | x |
| TRAVERSE Y 14 | 30 | S1 | S4 | c | y |
| TRAVERSE Y 45 | 31 | S4 | S5 | a | x |
| TRAVERSE X 51 | 32 | S5 | S1 | a | z |
|  | 33 | S1 | S1 | a | x |
|  | 34 | S1 | S1 | a | x |
| TRAVERSE Y 14 | 35 | S1 | S4 | c | y |
| TRAVERSE X 42 | 36 | S4 | S3 | b | z |
|  | 37 | S3 | S5 | a | y |
|  | 38 | S5 | S1 | a | z |

OPTIMAL TEST GENERATION FOR FINITE STATE MACHINE MODELS

TECHNICAL FIELD

This invention relates to testing an entity representable as a finite state machine and, more particularly, to the creation of testing sequences therefor.

BACKGROUND OF THE INVENTION

Testing hardware, firmware, and software implementations of communication protocols, testing VLSI circuits and testing rule-based expert systems, to name a few, in effective and efficient ways is crucial for the successful operation and maintenance of the end products. During product development, designers would quickly grasp the chance to uncover as many implementation errors as possible thereby eliminating or severely reducing costly correction and maintenance after product release.

Product complexity and informality of the underlying product specification or interface protocol make exhaustive testing, that is, testing every testable aspect of the specified product, impractical or even infeasible without at least some well-guided computer assistance. It has been estimated that testing a communication protocol implementation at the network layer (ISO layer 3) for ISDN services without an efficient technique for minimizing the testing would require at least ten days due to complexity of the services offered. Ad hoc testing of rule-based expert systems is expected to require a minimum of several months time. In all, testing would be conducted in these examples on only a subset of testable aspects for the product at hand. As a result, the testing procedure would admit a number and, perhaps, a seriously large number of implementation errors to exist undetected.

Looking in more detail at the example of a communication protocol, it is understood that protocols are a precise set of rules used to define possible interactions among elements of a complex communication system. To ensure that such system elements communicate reliably when the system is finally implemented, the system protocols as implemented must be tested for conformance to their specification. Typically, a protocol implementation is tested for conformance by applying, by means of an external tester, a sequence of inputs and verifying that the corresponding sequence of outputs is as expected. Testing is further complicated by limited controllability and observability of the protocol implementation by the external tester. These limitations serve, in the first instance, to inhibit the tester from placing the protocol into a predetermined state and, in the second instance, to inhibit direct observation of the state of the protocol implementation. Since even the most simple protocols may admit an astronomically large number of input sequences, protocol testing becomes a combinatorially challenging problem.

To address these concerns, a method for mechanizing the testing process using unique input/output sequences was disclosed in U.S. Pat. No. 4,692,921 issued to A. Dahbura et al. on Sept. 8, 1987 and commonly assigned. The disclosed method is said to tour through and test all edges of a finite state machine. Protocols and VLSI circuits may be modeled as deterministic finite state machines represented as a directed graph. Vertices of the graph correspond to states of the machine and a directed edge of the graph, from one vertex to the same or a different vertex, represents a transition between the two states. According to the patented method, a test for each edge is developed by constructing a three-part test sequence. The first part is a sequence that places the machine at the head state of the edge, that is, at the state which enables the edge to be reached. The second part executes the transition of the edge by supplying the input signal expected by that edge. Traversal of the edge places that machine in the tail state of the edge. Verification that the tail state was indeed reached is accomplished by the third part of the sequence which provides a input/output sequence unique to the tail state. Unique input/output sequences are selected on the basis of minimized length.

SUMMARY OF THE INVENTION

Faster, yet, completely efficient and exhaustive testing is afforded an entity (e.g., protocol, VLSI circuit, software application) represented as finite state machines by employing the present method in which test sequences are generated according to minimum cost function rules. Minimum cost unique signatures are developed for state identification of the finite state machine. Based upon the minimum cost unique signatures, a minimum cost test sequence is generated to cover every state transition of the finite state machine. As a result, every testable aspect of the entity is guaranteed to be tested using a minimum number of steps which represents a considerable cost savings.

It is an object of the inention to generate test sequences which can detect extremely high percentages of functional level discrepancies between the specification of an entity and its implementation.

It is a further object of the invention to provide compact test sequences for almost any entity.

BRIEF DESCRIPTION OF THE DRAWING

A more complete understanding of the invention may be obtained by reading the following description of a specific illustrative embodiment of the invention in conjunction with the appended drawing in which:

FIGS. 4 and 4A show a final minimum cost test sequence for the finite state machine of FIG. 1 in accordance with the principles of the invention.

DETAILED DESCRIPTION

Figure 1:
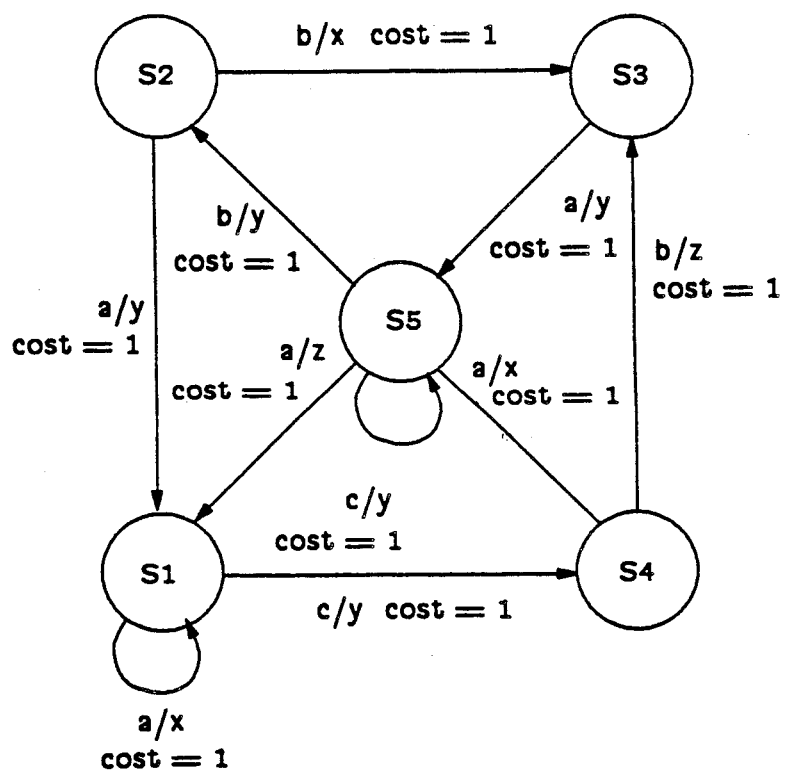
FIG. 1 shows an exemplary finite state machine as a directed graph representing and entity.

A specification for an entity such as a hardware device or a software application or a communications protocol can be described as an abstract model called a finite state machine. The finite state machine has a finite number of states and changes from one state to another when an input or stimulus is applied to the machine. A state is defined as a stable condition in which the entity or finite state machine rests until the next stimulus or input is applied. Each input also causes the finite state machine to generate an observable output. FIG. 1 shows a graph representation of a finite state machine. The machine shown in FIG. 1 is deterministic because a particular input symbol causes at most one transition from each state in the machine.

As shown in FIG. 1, a finite state machine is represented as and its behavior is described by a directed graph called a state diagram wherein a node or vertex of the graph (shown as a circle in FIG. 1) corresponds to a state of the finite state machine and wherein a directed edge between two nodes or a node and itself (shown as an arrow between two circles in FIG. 1) corresponds to a transition from one state to another. The directed graph representation of a finite state machine provides an easy way to visualize the operation of the finite state machine and, thereby, the corresponding entity. Each directed edge of the graph is labeled both by the particular input symbol which causes the state transition and by the observable output symbol generated thereby. Each state transition is also assigned a cost value to indicate the difficulty to realize that state transition relative to the other transitions. Cost may be indicative of the time taken to realize the state transition. For example, a state transition that requires a timer to expire will have a higher cost because it takes a longer time than those state transitions requiring simple message exchanges.

In this disclosure, the notation used to represent a directed edge is a quadruple shown as $(S_i, S_j, L_k; C_k)$, where the edge is directed from state $S_i$ to state $S_j$ with a label of $L_k$ and a cost value of $C_k$. Cost values are assumed to be integers equal to or greater than 1. For example, in FIG. 1, the edge from state $S_1$ to state $S_4$ is represented in this notation as $(S_1, S_4; c/y; 1)$.

Test sequences generated by the method disclosed herein are necessary to test whether there is a discrepancy between the specification and the implementation of the entity represented by the finite state machine. Therefore, every edge specified in the directed graph should be tested to check whether it is implemented correctly. Testing an edge $(S_i, S_j; L_k; C_k)$ takes place in three steps as follows:

Step 1: Put the finite state machine implementation in state $S_i$;

Step 2: Apply the input specified by label $L_k$ and verify that the output, which is also specified by the label $L_k$, generated by the finite state machine implementation is as expected; and Step 3: Verify that the new state of the finite state machine implementation is $S_j$.

In general, the steps described above are not realized in a trivial manner for a given finite state machine implementation for two reasons: limited controllability and limited observability of the finite state machine.

Due to the limited controllability of the finite state machine implementation, it has not been possible prior to the present invention to put the finite state machine into state $S_i$ in Step 1 of the above procedure without realizing several state transitions. For example, in FIG. 1, it takes two state transitions to put the finite state machine into state $S_5$ starting from the initial state $S_1$: first, the $S_1$ to $S_4$ transition is accomplished by applying input c and then the $S_4$ to $S_5$ transition is accomplished by applying input a. Without an efficient solution to overcome this difficulty, the number of state transitions required to completely test a real-life entity implemented as a finite state machine would typically require thousands of state transitions. In turn, the time needed to execute such tests in a laboratory would become unacceptably large.

Due to the limited observability of the finite state machine implementation, it has not been possible to directly verify that the implementation is in state $S_j$ in Step 3 of the above procedure. For example, consider the state transitions from state $S_1$ to $S_4$ then to $S_5$ by applying input c followed by input a in FIG. 1. There has not been any way of knowing that the finite state machine implementation actually makes these state transitions by observing the outputs y and x generated by the implementation. If, due to an error in the manufacturing, the implementation stayed in $S_1$ instead of moving to $S_4$ after input c is applied, it would have generated the same output x when input a was applied since both $S_1$ and $S_4$ have an edge labeled as a/x. In this example, the final state of the implementation would have been state $S_1$ instead of $S_5$. Therefore, verifying the state of a finite state machine implementation is critical to improving the effectiveness of a test in terms of the ability to detect implementation errors.

In the present invention, the problems of limited controllability and limited observability for testing the finite state machine are solved by generating a test sequence that has extremely high fault coverage and minimum cost. Particularly, limited controllability is overcome by concatenating tests defined for each edge of the finite state machine graph in such a way that the resulting test sequence has a minimum cost. With respect to resolving limited observability, the method for generating optimal test sequences modifies the previously described Unique Input/Output (UIO) sequences.

A UIO sequence of a given state is a series of input/output messages such that the input messages generate a series of output messages that are unique for that given state. When the input messages that are unique for that given state. When the input messages that are unique for that given state. When the input messages specified by the UIO sequence of state $S_i$ are applied to a finite state machine, the output messages generated by the machine would be generated only if the machine were in state $S_i$. For example, the UIO sequence of state $S_2$ in FIG. 1 is b/x. For the actual method described in U.S. Pat. No. 4,692,921, minimum length UIO test sequences are generated where length is defined as the number of graph edges contained in the UIO sequence. As stated above, the method of the '921 patent is modified so that UIO sequences are selectively generated on the basis of minimum cost rather than minimum length. As such, the modified method generates test sequences which are several times shorter than the test sequences generated by using the method of the '921 patent for the same directed graph.

Figure 2:
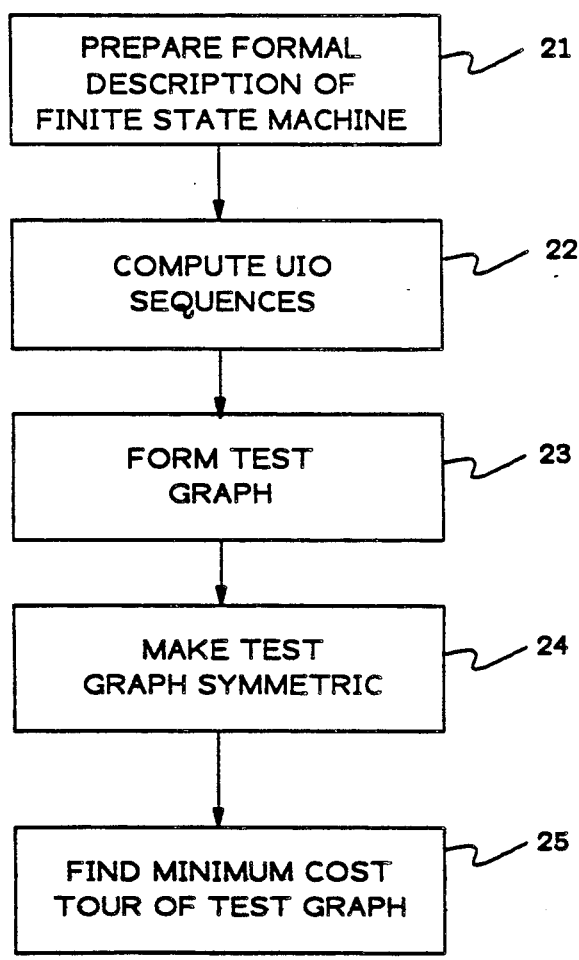
FIG. 2 shows a simplified flow chart description of the test sequence generation method in accordance with the principles of the invention.

The present method for generating optimal test sequences for finite state machine implementations is given in FIG. 2. Each step is described in detail below.

In the first step of the method shown as block 21, a formal description of the finite state machine is prepared based on the description (specification) of the entity. A written specifications for the entity manufacturer typically provides a sufficient description of the finite state machine in an informal way, for example in English. A formal description of the finite state machine specification is required in order to generate our minimum cost test sequences. In a formal description of the finite state machine, state and transition information is provided as follows: all states defined for the finite state machine including the initial or reset state, all input and output messages defined for each state together with the respective next states and a relative cost value for each state transition. One exemplary formal description of a finite state machine is shown in FIG. 1 as the directed graph representation.

In the second step of the method shown in FIG. 2 as block 22, minimum-cost UIO sequences are found for every state of the finite state machine specification given in first step (block 21). Based on the labels of the state transitions, each state is examined for a set of input messages that will generate output messages to uniquely identify that state. Cost of each UIO sequence is computed by adding the cost values of the edges which comprise the minimum cost UIO sequence. As stated above, the method for finding UIO sequences is presented in U.S. Pat. No. 4,692,921 whose teachings are expressly incorporated herein by reference. Our modification of this method is presented below as follows: the selection criteria for defining UIO sequences is total cost over all the edges in a given UIO sequence rather than the total number of edges or length of a UIO sequence. The modified criteria is easily incorporated in the original UIO sequence generation method by simply inserting minimum cost as the criteria for UIO sequence selection into "Substep D" of method in the '921 patent.

Figure 3:
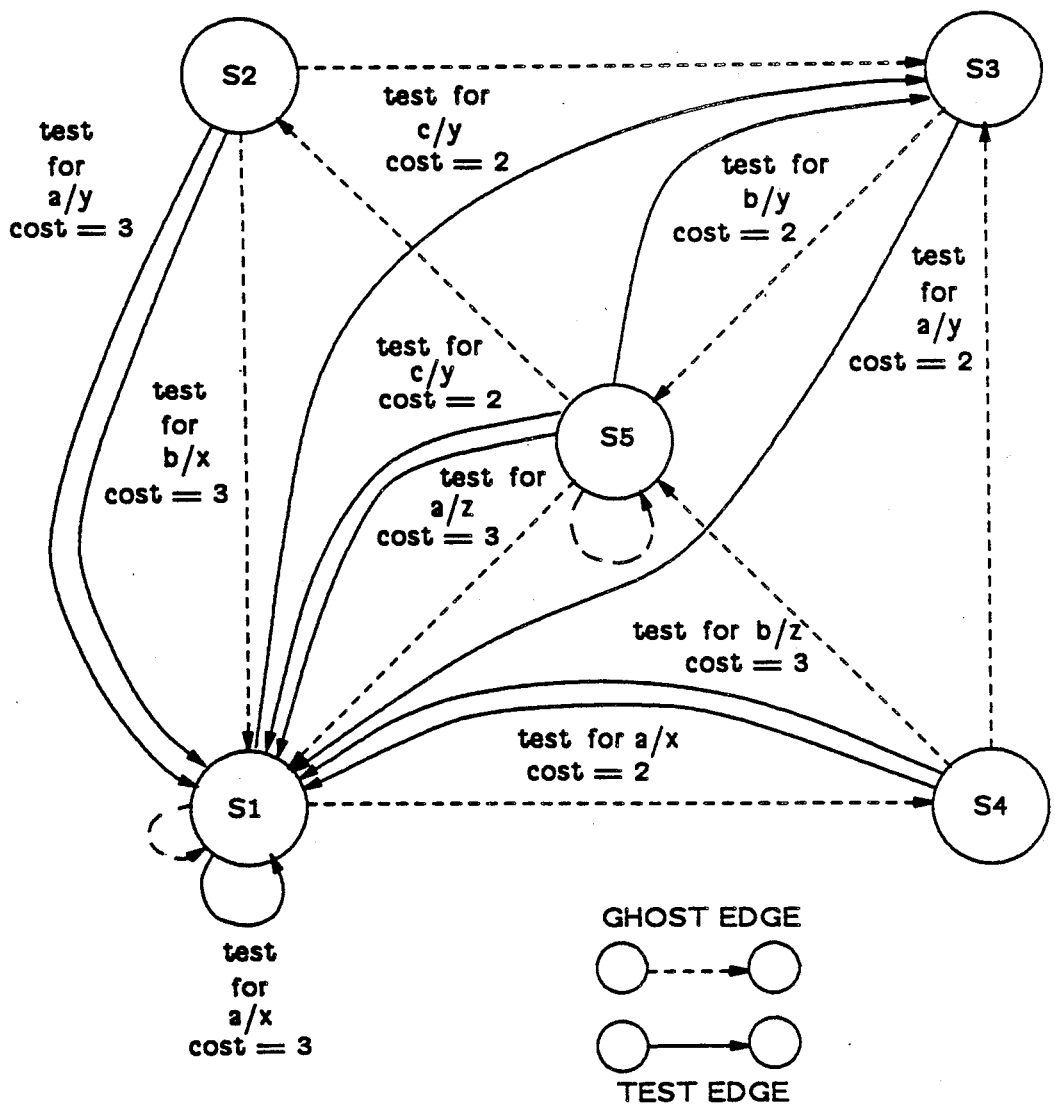
FIG. 3 shows a test graph related to the finite state machine for FIG. 1 and developed in accordance with the principles of the invention.

In the third step of the method for generating optimal test sequences shown as block 23 in FIG. 2, a test graph is formed based on the original finite state machine developed in the first step of the method (block 21) and the UIO seqences generated for each state in the second step of the method (block 22). A test graph related to the machine of FIG. 1 is shown in FIG. 3. Nodes of the test graph are the same as those in the original finite state machine. However, an additional set of edges is included in the test graph. The two sets of edges in the test graph are called Ghost Edges shown in FIG. 3 as dashed lines and Test Edges shown in FIG. 3 as solid lines. For each edge of the original finite state machine, a Test Edge is constructed in the test graph to represent actions required to test the corresponding edge of the original finite state machine graph. In other words, the label of a Test Edge consists of the input/output messages for the original finite state machine edge combined with the ending or tail state's minimum cost UIO sequence. Cost for a Test Edge is obtained by adding the cost value of the original edge to the cost value of the minimum cost UIO sequence.

Test Edges are constructed as follows. For an original finite state machine graph edge $(S_i, S_j, L_k, C_k)$, a Test Edge is constructed in the test graph as $(S_i, S_f, L_m; C_m)$ where $S_i$ is the starting or head state of the original edge, $S_f$ is the ending or tail state of the last input/output message in the UIO sequence of $S_j$, $L_m$ is the the input/output messages of the original edge combined with the edges specified by the minimum cost UIO sequence of $S_j$, $C_m$ is the cost value of the original edge added to the cost value of the minimum cost UIO sequence of $S_j$.

Consider the original graph edge from state $S_1$ to $S_4$ with label c/y in FIG. 1 (i.e., edge $(S_1, S_4; c/y; 1)$. In the test graph, the Test Edge constructed for the above-identified edge is $(S_1, S_3; c/y\ b/z; 2)$ as shown in FIG. 3. The Test Edge starts at starting or head state $S_1$ and ends at the ending or tail state of the last input/output message in minimum cost UIO sequence of $S_4$, which is $S_3$. The label of this new Test Edge is c/y b/z. The cost value of the Test Edge is 2 since the original edge and the UIO of $S_4$ each have a cost value of 1.

Ghost Edges in the test graph correspond exactly to edges in the original finite state machine. They will be used as optional edges such as for short-cuts between the Test Edges in the following step of the method. Therefore, it can be said that for each original finite state machine graph edge $(S_i, S_j; L_k; C_k)$ a Ghost Edge $(S_i, S_j; L_k; C_k)$ is constructed in the test graph.

In the fourth step of the optimal test sequence generation method shown as block 24 in FIG. 2, it is necessary to make the test graph obtained in the third method step (block 23) symmetric by duplicating the Test and Ghost Edges in such a way that the total cost of duplications is minimum. A graph is called "symmetric" if, for every node of the graph, the number of edges directed toward a node is equal to the number of edges away from it. The nodes of the test graph shown in FIG. 3 do not satisfy this criteria and the test graph is not symmetric. In the fourth step of the method, it will be made symmetric. If the Test Graph, with respect to the Test Edges, is already symmetric, then the method advances directly to the fifth method step (block 25).

For a non-symmetric test graph, it is necessary to define variables for each node as follows. For a node $S_i$ and for each Test Edge directed towards $S_i$, define a variable $X_{toward\_Si}$ to represent the number of times that edge needs to be duplicated. That is, the number of additional copies of that edge is needed. Duplication is performed to make the graph symmetric. Similarly, define a variable $X_{away\_Si}$ for each edge directed away from node $S_i$. Initially, variables $X_{toward\_Si}$ and $X_{away\_Si}$ are set to zero.

For the Ghost Edges, define variables $Y_{toward\_Si}$ and $Y_{away\_Si}$ for each node $S_i$. Initially, variables $Y_{toward\_Si}$ and $Y_{away\_Si}$ are set to zero.

An equation for each node $S_i$ is constructed as follows:

$$\sum_{\substack{\text{all edges} \\ \text{toward node } Si}} (X_{toward\_Si} + 1) + \sum_{\substack{\text{all edges} \\ \text{toward node } Si}} (Y_{toward\_Si}) -$$

$$\sum_{\substack{\text{all edges} \\ \text{away node } Si}} (X_{away\_Si} + 1) - \sum_{\substack{\text{all edges} \\ \text{away node } Si}} (Y_{away\_Si}) = 0.$$

where $$\sum_{\substack{\text{all edges} \\ \text{toward node } Si}} \quad \text{and} \quad \sum_{\substack{\text{all edges} \\ \text{away node } Si}}$$

represent summations of variables defined for each edge directed towards or away from node $S_i$, respectively.

After an equation is written for each node of the test graph according to the construct shown above, the step of making the test graph symmetric with minimum total cost of test edges can be accomplished as follows:

$$\text{minimize} \left\{ \sum_{\substack{\text{all edges of} \\ \text{all nodes}}} (X_{toward\_Si} \cdot C_k + X_{away\_Si} \cdot C_l + \right.$$

$$\left. Y_{toward\_Si} \cdot C_m + Y_{away\_Si} \cdot C_n) \right\}$$

where $$\sum_{\text{all edges of all nodes}}$$

represents a summation of variables defined for every Test and Ghost Edge in the test graph and $C_k$, $C_l$, $C_m$, and $C_n$ are the corresponding cost values of Test and Ghost Edges. Minimization is subject to the equations constructed for each node and the condition of $X_{toward\_Si} \geq 0$, $X_{away\_Si} \geq 0$, $Y_{toward\_Si} \geq 0$, and $Y_{away\_Si} \geq 0$.

The task of finding a solution for the above-stated minimization problem is equivalent to solving the so-called *Rural Chinese Postman Problem* defined in graph theory. See, for example, J. K. Lenstra et al., "On General Routing Problems," *Networks*, Vol. 6, pp. 273-280 (1976). The Rural Chinese Postman Problem is stated as the problem of finding a minimum cost tour for a subset of edges in a directed graph. A tour is defined as a walk that starts and ends at the same node. In FIG. 1, the sequence of transitions a/x, b/x, b/y, c/z constitutes a tour from state $S_1$. A walk is defined as a finite, non-null sequence of consecutive edges. In FIG. 1, the sequence of transitions a/x, b/x, b/y constitutes a walk from state $S_1$ to state $S_3$. For the most general case, this problem is known in the literature as one for which there cannot be found a polynomial-time (i.e., time efficient) solution algorithm. That is, the solution is NP-complete.

For a subclass of this problem, the present optimal test sequence generation method provides a solution by exploring certain structures common to the class of graphs generated by the finite state machines which are designed to be implemented as opposed to directed graphs, in general. Our method guarantees a minimum cost solution if an finite state machine has either or both of the following attributes: (a) a reset capability and/or (b) a self-loop property. A finite state machine is said to have the reset capability if it can move to its initial state from any other state with a single message. This capability, for example, is equivalent to the ability to turn off a machine at any given time. The self-loop property of an finite state machine is defined as the existence of at least one state transition for each state such that the next state of the finite state machine is the same the current state. That is, the finite state machine does not change its state for at least one state transition at each state. This property can be visualized as the existence of an input for each state that can be ignored by the implementation. For example, in a communications system this may be like trying to dial when a telephone is on-hook.

In order to further guarantee a minimum cost solution, it is assumed that the directed graph representing an finite state machine is strongly-connected. A graph is said to be strongly-connected if there is a path between any pair of nodes. A path is defined as a finite, non-null sequence of consecutive edges organized so that no node is visited more than once by the path. A strongly-connected graph corresponds to a specification that does not have any deadlocks. The latter assumption, which is satisfied by all finite state machine specifications that are expected to be implemented, is included only for completeness.

The formulation of the graph symmetrization problem as presented in this fourth step (block 24) allows the use of standard linear programming or network flow techniques reported in the literature to solve this problem. An example technique to solve the linear programming problems is found, for example, in J. Edmonds et al., "Matching, Euler Tours and the Chinese Postman," *Mathematical Programming*, Vol. 5, pp. 88-124 (1973). and the network flow techniques in *J. of ACM*, vol. 19, No. 2, pp. 248-264 (1972).

Interpretation of a solution (i.e., zero or positive values found for the Test and Ghost Edge variables) for the above problem is as follows. Nonzero positive values of $X_{toward\_Si}$ and $X_{away\_Si}$ represent the number of duplicate copies of corresponding Test Edges which are needed to make the test graph symmetric; zero values in the solution for $X_{toward\_Si}$ and $X_{away\_Si}$ mean that those Test Edges are not needed to be duplicated. The interpretation, however, for the Ghost Edges is different. Positive values found for the Ghost Edge variables $Y_{toward\_Si}$ and $Y_{away\_Si}$ indicate the number of times that Ghost Edge will be used in the test graph as opposed to the number of times a duplicate copy is made; zero values indicate that corresponding Ghost Edges will not be used in the Symmetric test graph.

In the fifth step of the method shown as block 25, a minimum cost tour is found for the symmetric test graph. The test graph is made symmetric at the previous step in such a way that the total cost of the Test and Ghost Edges (including the duplications) is minimum. Therefore, a tour that traverses every edge of the symmetric test graph exactly once will be a minimum cost tour of the test graph. In the literature, algorithms are reported for finding an Euler tour which is defined as traversing every edge of a symmetric directed graph. Such an algorithm is found for example in the Edmonds et al. reference above.

EXAMPLE

The following example is given to be illustrative of the method described above. In this example, minimum cost UIO sequences are found for the finite state machine of FIG. 1. Based on those UIO sequences, a minimum cost test sequence is generated. Note that the example of FIG. 1 is a strongly-connected graph. Although it does not satisfy the two sufficient but not necessary conditions given above, there exists a solution based on our procedure.

According to the first method step, the finite state machine to be tested is represented by a directed graph in FIG. 1. The formal description of this directed graph is given in FIG. 3 which has the format described above.

According to the second step of the method, minimum-cost UIO sequences for the finite state machine of FIG. 1 are found as:

UIO for state s1: a/x a/x Cost=2
UIO for state s2: b/x Cost=1
UIO for state s3: a/y a/z Cost=2
UIO for state s4: b/z Cost=1
UIO for state s5: a/z Cost=1

According to the third method step, Test and Ghost Edges for the original graph edges of FIG. 1 are constructed as follows:

| Original Edge | Test Edge | Ghost Edge |
|---|---|---|
| (s1,s1; a/x; 1) | (s1,s1; a/x a/x a/x; 3) | (s1,s1; a/x; 1) |
| (s1,s4; c/y; 1) | (s1,s3; c/y b/z; 2) | (s1,s4; c/y; 1) |
| (s2,s3; b/x; 1) | (s2,s1; b/x a/y a/z; 3) | (s2,s3; b/x; 1) |
| (s2,s1; a/y; 1) | (s2,s1; a/y a/x a/x; 3) | (s2,s1; a/y; 1) |
| (s3,s5; a/y; 1) | (s3,s1; a/y a/z; 2) | (s3,s5; a/y; 1) |
| (s4,s3; b/z; 1) | (s4,s1; b/z a/y a/z; 3) | (s4,s3; b/z; 1) |
| (s4,s5; a/x; 1) | (s4,s1; a/x a/z; 2) | (s4,s5; a/x; 1) |
| (s5,s1; a/z; 1) | (s5,s1; a/z a/x a/x; 3) | (s5,s1; a/z; 1) |
| (s5,s2; b/y; 1) | (s5,s3; b/y b/x; 2) | (s5,s2; b/y; 1) |
| (s5,s5; c/y; 1) | (s5,s1; c/y a/z; 2) | (s5,s5; c/y; 1) |

The test graph of the original finite state machine graph is shown in FIG. 3. Note that, in FIG. 3, the Test and Ghost Edges are indicated as solid and dotted directed lines, respectively.

In the fourth method step, variables for Test and Ghost Edges of the test graph obtained in the previous step are defined as follows:

| Test Edge | Variable | Ghost Edge | Variable |
|---|---|---|---|
| (s1,s1; a/x a/x a/x; 3) | $X_{11}$ | (s1,s1; a/x; 1) | $Y_{11}$ |
| (s1,s3; c/y b/z; 2) | $X_{13}$ | (s1,s4; c/y; 1) | $Y_{14}$ |
| (s2,s1; b/x a/y a/z; 3) | $X_{21}$ | (s2,s3; b/x; 1) | $Y_{23}$ |
| (s2,s1; a/y a/x a/x; 3) | $X_{22}$ | (s2,s1; a/y; 1) | $Y_{21}$ |
| (s3,s1; a/y a/z; 2) | $X_{35}$ | (s3,s5; a/y; 1) | $Y_{35}$ |
| (s4,s1; b/z a/y a/z; 3) | $X_{41}$ | (s4,s3; b/z; 1) | $Y_{43}$ |
| (s4,s1; a/x a/z; 2) | $X_{42}$ | (s4,s5; a/x; 1) | $Y_{45}$ |
| (s5,s1; a/z a/x a/x; 3) | $X_{51}$ | (s5,s1; a/z; 1) | $Y_{51}$ |
| (s5,s3; b/y b/x; 2) | $X_{52}$ | (s5,s2; b/y; 1) | $Y_{52}$ |
| (s5,s1; c/y a/z; 2) | $X_{53}$ | (s5,s5; c/y; 1) | $Y_{55}$ |

The equations for each node of the test graph of FIG. 3 using the variables defined above are constructed as follows:

For Node $S_1$:

$$X_{11}+1+X_{21}+1+X_{22}+1$$
$$+X_{31}+1+X_{41}+1+X_{42}+1+X_{51}+1+X_{52}+1-$$
$$X_{11}-1+Y_{11}+Y_{51}+Y_{21}+Y_{11}=0$$

For Node $S_2$:

$$Y_{52}-X_{21}-X_{22}-Y_{21}-Y_{23}=2$$

For Node $S_3$:

$$X_{13}+1+X_{53}+1-X_{31}-1+Y_{23}+Y_{43}-Y_{35}=0$$

For Node $S_4$:

$$-X_{41}-1-X_{42}-1+Y_{14}-Y_{45}-Y_{43}=0$$

For Node $S_5$:

$$-X_{51}-1-X_{52}-1+Y_{35}+Y_{45}+Y_{55}+Y_{51}-Y_{52}-Y_{55}=0$$

To make the test graph symmetric with minimum-cost duplications, the following minimization has to be realized while satisfying the conditions given by the above set of equations:

minimize $(3 X_{11} + 2 X_{13} + 3 X_{21} + 3 X_{22} + 2 X_{35} + 3 X_{41} + 2 X_{42} + 3 X_{51} + 2 X_{52} + 2 X_{53} + 1 Y_{11} + 1 Y_{14} + 1 Y_{21} + 1 Y_{23} + 1 Y_{35} + 1 Y_{43} + 1 Y_{45} + 1 Y_{51} + 1 Y_{52} + 1 Y_{55})$ An additional constraint for the above minimization problem is that each variable defined for Test and Ghost Edges must be equal to or greater than zero. A value that is less than zero will not be meaningful.

Using the linear programming technique given, for example, in the *Linear Programming* text by R. I. Rothenberg in 1979 (pp. 153-189), the following solution is obtained:

| Test Edge | Test Edge Variable | Solution Value | Ghost Edge | Ghost Edge Variable | Solution Value |
|---|---|---|---|---|---|
| (s1,s1; a/x a/x a/x; 3) | $X_{11}$ | 0 | (s1,s1; a/x; 1) | $Y_{11}$ | 0 |
| (s1,s3; c/y b/z; 2) | $X_{13}$ | 0 | (s1,s4; c/y; 1) | $Y_{14}$ | 6 |
| (s2,s1; b/x a/y a/z; 3) | $X_{21}$ | 0 | (s2,s3; b/x; 1) | $Y_{23}$ | 0 |
| (s2,s1; a/y a/x a/x; 3) | $X_{22}$ | 0 | (s2,s1; a/y; 1) | $Y_{21}$ | 0 |
| (s3,s1; a/y a/z; 2) | $X_{35}$ | 0 | (s3,s5; a/y; 1) | $Y_{35}$ | 1 |
| (s4,s1; b/z a/y a/z; 3) | $X_{41}$ | 0 | (s4,s3; b/z; 1) | $Y_{43}$ | 0 |
| (s4,s1; a/x a/z; 2) | $X_{42}$ | 0 | (s4,s5; a/x; 1) | $Y_{45}$ | 4 |
| (s5,s1; a/z a/x a/x; 3) | $X_{51}$ | 0 | (s5,s1; a/z; 1) | $Y_{51}$ | 0 |
| (s5,s3; b/y b/x; 2) | $X_{52}$ | 0 | (s5,s2; b/y; 1) | $Y_{52}$ | 2 |
| (s5,s1; c/y a/z; 2) | $X_{53}$ | 0 | (s5,s5; c/y; 1) | $Y_{55}$ | 0 |

In the fifth step of the method, a minimum-cost tour for the symmetric test graph obtained at the previous step, by using the algorithm given in the above-cited Edmonds et al. reference, is generated as follows:

$X_{11}, X_{13}, Y_{35}, X_{52}, X_{35}, Y_{14}, X_{45}, Y_{14}, Y_{45}, X_{52},$
$Y_{14}, Y_{45}, Y_{52}, X_{21}, Y_{14}, Y_{45}, Y_{52}, X_{22}, Y_{14}, Y_{45},$
$X_{51}, Y_{14}, X_{42}$

The above tour gives the order (reading from left to right) in which each Test or Ghost Edge is traversed. This tour can now be translated to the input and output messages, since the definition of each variable is known from the third step. As such, it constitutes the test sequence for the finite state machine given in FIG. 1. The test sequence corresponding to the above tour is given in FIG. 4, where each step is to be executed consecutively as indicated by the step number.

We claim:

1. A method for developing test sequences for evaluating a design or operation of a finite state machine, said finite state machine characterized by a state diagram having states and original edges interconnecting the states, said method comprising the steps of:
    evaluating unique input/output sequences for each state of said finite state machine so that the unique input/output sequence selected for each state exhibits a minimum cost among all unique input/output sequences evaluated for that state;

expanding said state diagram as a test graph including said states, said original edges, and a plurality of test edges interconnecting the states, said plurality of test edges for testing original edges of the state diagram;

evaluating said test graph for symmetry and, if not symmetric, duplicating selected test edges of said plurality to make said test graph symmetric with a minimum cost; and generating a tour of the symmetric test graph wherein each test edge is traversed at least once, so that said tour includes said test sequence for said finite state machine at a minimum cost.

* * * * *